United States Patent [19]
Ito et al.

[11] Patent Number: 5,384,537
[45] Date of Patent: Jan. 24, 1995

[54] NUCLEAR MAGNETIC RESONANCE IMAGING SYSTEM WITH NOISE REDUCED INTERCOM

[75] Inventors: Yukinobu Ito, Tochigiken; Eiji Moriya, Tokyo, both of Japan

[73] Assignee: Kabushiki Kaisha Toshiba, Kanagawaken, Japan

[21] Appl. No.: 54,522

[22] Filed: Apr. 28, 1993

[30] Foreign Application Priority Data

May 7, 1992 [JP] Japan ................... 4-114408

[51] Int. Cl.⁶ ............................... G01R 33/20
[52] U.S. Cl. ................... 324/318; 324/300; 381/94
[58] Field of Search .......... 324/318, 300, 309, 307; 128/653.2, 653.5; 381/71, 94

[56] References Cited
U.S. PATENT DOCUMENTS

| | | | |
|---|---|---|---|
| 4,689,565 | 8/1987 | Kemner et al. | 324/318 |
| 4,696,030 | 9/1987 | Egozi | 381/167 |
| 4,933,981 | 6/1990 | Lederer | 381/90 |
| 4,981,137 | 1/1991 | Kondo et al. | 324/318 |
| 5,133,017 | 7/1992 | Cain et al. | 381/71 |
| 5,313,945 | 5/1994 | Friedlander | 324/318 |

Primary Examiner—Kenneth A. Wieder
Assistant Examiner—Raymond Y. Mah
Attorney, Agent, or Firm—Limbach & Limbach

[57] ABSTRACT

A nuclear magnetic resonance imaging system with the intercom facility in which the disturbing and potentially harmful large noise due to the application of the reading gradient field pulses can be reduced at the exterior of the examination room. In the system, a connection between the microphone and the loudspeaker for transmitting the sounds generated inside the examination room to the exterior of the examination room is controlled according to the pulse sequence specified by the sequence controller such that the microphone and the loudspeaker are disconnected whenever the application of the reading gradient field pulse takes place. Alternatively, the system incorporates a notch filter connected between the microphone and the loudspeaker for transmitting the sounds generated inside the examination room to the exterior of the examination room, where the notch filter attenuates the component of the sounds having a central frequency equal to a repetition frequency of repeatedly applied reading gradient field pulses in the pulse sequence specified by the sequence controller.

5 Claims, 3 Drawing Sheets

NUCLEAR MAGNETIC RESONANCE IMAGING SYSTEM WITH NOISE REDUCED INTERCOM

BACKGROUND OF THE INVENTION

1. Field of the Invention

The present invention relates to a nuclear magnetic resonance imaging (referred hereafter as MRI) system, and more particularly, to an intercommunication facility (referred hereafter as intercom) incorporated in the MRI system.

2. Description of the Background Art

The MRI system has been utilized for a medical diagnosis in order to obtain the tomographic image of the patient. In the medical diagnosis using the MRI system, the patient is placed inside the static magnetic field generated by the MRI apparatus, and the RF (radio frequency) pulses are applied from the RF coil of the MRI apparatus onto the patient placed in the static magnetic field so as to excite the hydrogen atoms within the patient. Then, the nuclear magnetic resonance signals (referred hereafter as MR signals) emitted from the patient as the excited hydrogen atoms return to their stable states are received from a desired tomographic plane specified by the gradient magnetic fields applied by the MRI apparatus onto the patient, and the tomographic image of the specified tomographic plane is reconstructed according the received MR signals.

In such an MRI system, the frame body of the MRI apparatus itself is located inside an isolated examination room and the controlling of the MRI apparatus is carried out from a system control unit located outside of the examination room.

Here, the examination room is usually equipped with the electromagnetic shielding because the presence of the external electromagnetic waves with the same frequency as the MR signals to be detected can cause the adverse effects such as the appearance of the artifact on the reconstructed tomographic images.

Consequently, the MRI system incorporates an intercom facility for enabling the communication between the interior of the examination room and the exterior of examination room.

Conventionally, the intercom facility provided in the MRI system has a configuration as shown in FIG. 1A, in which the intercom comprises a set of a microphone 1 and a loudspeaker 2 for transmitting sounds from the exterior of the examination room to the interior of the examination room which can be connected or disconnected by a switch 5, and a set of a microphone 3 and a loudspeaker 4 for transmitting sounds from the interior of the examination room to the exterior of the examination room which can be connected or disconnected by a switch 6, where the switches 5 and 6 are controlled by an intercom controller 7. In this FIG. 1A, the frame body 8 located inside the examination room and the system control unit 9 located outside the examination room are also depicted as separate entities independent from the above described intercom facility, although the intercom facility can be incorporated integrally within the frame body 8 and the system control unit 9 in practice.

Now, in this conventional intercom facility shown in FIG. 1A, the intercom controller 7 controls the ON/OFF of the switches 5 and 6 according to the timing chart shown in FIG. 1B, in which the ON/OFF states 11 and 12 of the switches 6 and 5, respectively, are indicated along with the reading gradient field pulse 10 of the pulse sequence to be executed. Namely, the switch 6 for a sound transmission from the interior to the exterior is normally put in the ON state, as the intercom facility cannot be controlled from the interior of the examination room, such that the sound inside the examination room is audible at the exterior of the examination room. While the switch 6 is in the ON state, the switch 5 for a sound transmission from the exterior to the interior remains in put the OFF state so that the sound outside of the examination room is inaudible at the interior of the examination room. When the switch 5 is turned into the ON state as the communication from the exterior of the examination room to the interior of the examination room is required, the switch 6 is turned into the OFF state such that the speech uttered at the exterior of the examination room becomes audible at the interior of the examination room. During the application of the reading gradient field pulse 10, the switch 6 remains in the ON state while the switch 5 remains in the OFF state normally, as indicated in FIG. 1B.

However, in the MRI apparatus, the application of the reading gradient field pulses causes the vibrations on the bobbin around which the gradient field coils are wound, and these vibrations in turn causes a large noise, so that the large noise due to the application of the reading gradient field pulses is also transmitted from the interior to the exterior through the intercom facility as the switch 5 remains in the ON state during the application of the reading gradient field pulses. This problem becomes prominent in the high speed type MRI apparatus that is under the development in recent years, because the imaging pulse sequence for the high speed imaging scheme such as the echo planar imaging uses the strong reading gradient field which is to be repeatedly reversed in rapid successions.

As a consequence, the hearing of the operator at exterior of the examination room can be considerably disturbed by the large noise transmitted through the intercom facility to a level at which the correct hearing of the speech uttered by the patient inside the examination room becomes difficult. Moreover, in some cases, the large noise transmitted through the intercom facility can be even harmful to the operator's ears.

SUMMARY OF THE INVENTION

It is therefore an object of the present invention to provide an MRI system with the intercom facility in which the disturbing and potentially harmful large noise due to the application of the reading gradient field pulses can be reduced at the exterior of the examination room.

According to one aspect of the present invention there is provided a nuclear magnetic resonance imaging system, comprising: nuclear magnetic resonance imaging means for carrying out a nuclear magnetic resonance imaging, located inside an isolated examination room; sequence controller means for specifying a pulse sequence to be executed by the nuclear magnetic resonance imaging means; and intercom means including: microphone means, located inside the examination room, for picking up sounds generated inside the examination room; loudspeaker means, located outside the examination room and disconnectably connected with the microphone means, for outputting the sounds picked up by the microphone means to the exterior of the examination room; and intercom controller means, connected with the sequence controller means, for disconnecting the microphone means and the loudspeaker means whenever an application of a reading gradient field pulse takes place in the pulse sequence specified by the sequence controller means.

According to another aspect of the present invention there is provided a nuclear magnetic resonance imaging system, comprising: nuclear magnetic resonance imaging means for carrying out a nuclear magnetic resonance imaging, located inside an isolated examination room; sequence controller means for specifying a pulse sequence to be executed by the nuclear magnetic resonance imaging means; and intercom means including: microphone means, located inside the examination room, for picking up sounds generated inside the examination room; and loudspeaker means, located outside the examination room and connected with the microphone means, for outputting the sounds picked up by the microphone means to the exterior of the examination room; notch filter means, connected between the microphone means and the loudspeaker means for attenuating a central frequency component in the sounds picked up by the microphone means having an externally supplied central frequency and supplying obtained sounds with the central frequency component attenuated to the loudspeaker means; and central frequency setting means for determining the central frequency according to the pulse sequence specified by the sequence controller means and supplying the determined central frequency to the notch filter means.

Other features and advantages of the present invention will become apparent from the following description taken in conjunction with the accompanying drawings.

DETAILED DESCRIPTION OF THE PREFERRED EMBODIMENTS

Figure 2A:
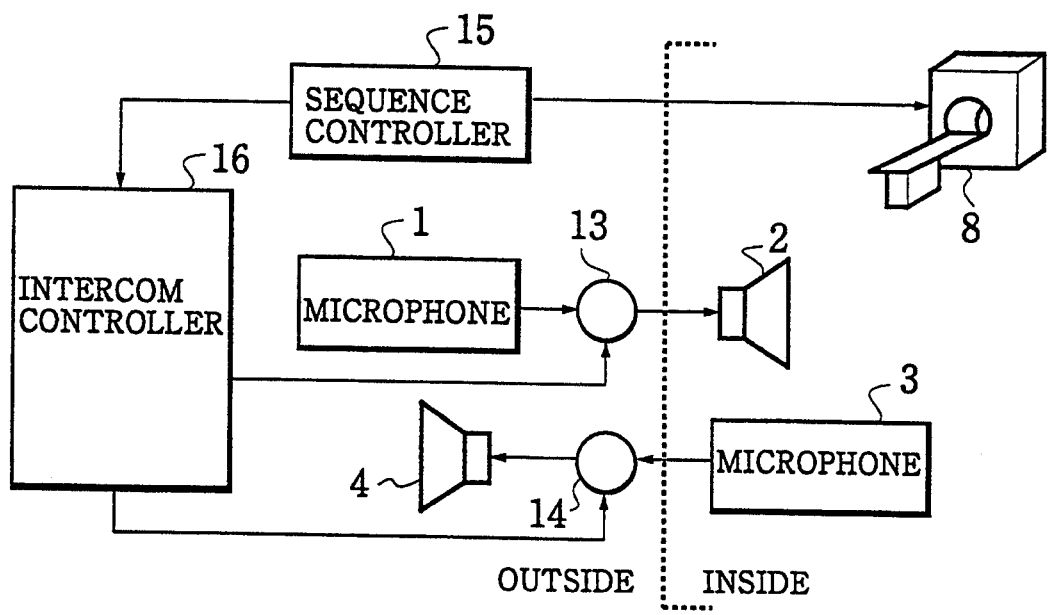
FIG. 2A is a schematic block diagram of a first embodiment of an MRI system with intercom facility according to the present invention.
Figure 2B:
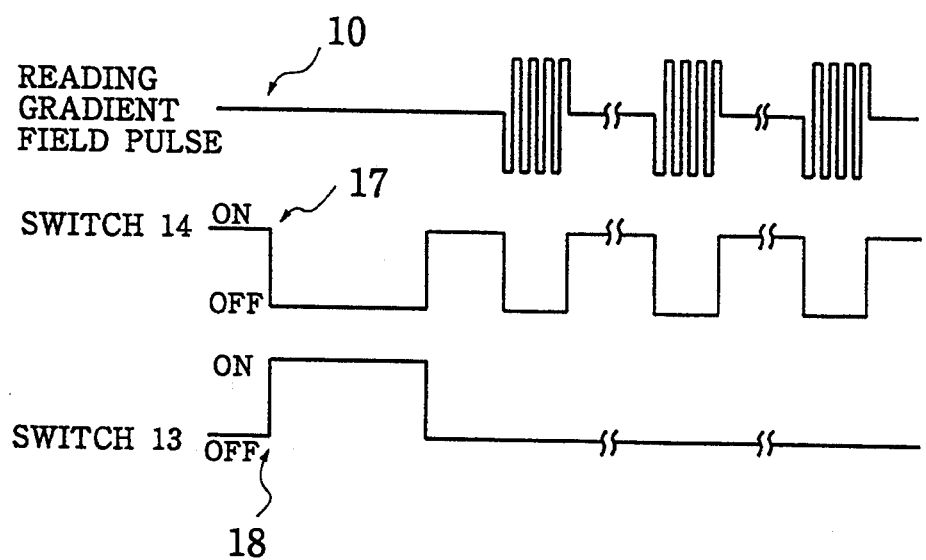
FIG. 2B is a timing chart for the controlling to be made by an intercom controller in the MRI system of FIG. 2A.

Referring now to FIGS. 2A and 2B, the first embodiment of an MRI system with intercom facility according to the present invention will be described in detail.

In this first embodiment, as shown in FIG. 2A, the intercom comprises a set of a microphone 1 and a loudspeaker 2 for transmitting sounds from the exterior of the examination room to the interior of the examination room which can be connected or disconnected by a switch 13, and a set of a microphone 3 and a loudspeaker 4 for transmitting sounds from the interior of the examination room to the exterior of the examination room which can be connected or disconnected by a switch 14, where the switches 13 and 14 are controlled by an intercom controller 16 independently.

In this FIG. 2A, a frame body 8 of an MRI apparatus located inside the examination room and a sequence controller 15 provided as a part of a-system control unit of the MRI apparatus located outside the examination room are also depicted as separate entities independent from the above described intercom facility, although the intercom facility can be incorporated integrally within the frame body 8 and the system control unit in practice.

Here, the sequence controller 15 is connected with both the frame body 8 and the intercom controller 16 such that the sequence controller 15 supplies the pulse sequence to be executed to the frame body 8, while also supplying a signal indicative of the timings for the application of the reading gradient field pulses to the intercom controller 16, such that the intercom controller 16 controls the switches 13 and 14 according to this signal supplied from the sequence controller 15.

More specifically, in this first embodiment, the intercom controller 16 controls the ON/OFF of the switches 13 and 14 according to the timing chart shown in FIG. 2B, in which the ON/OFF states 17 and 18 of the switches 14 and 13, respectively, are indicated along with the reading gradient field pulse 10 of the pulse sequence specified by the sequence controller 15.

Namely, the switch 14 for a sound transmission from the interior of the examination room to the exterior of the examination room is normally put in the ON state, such that the speeches uttered inside the examination room are audible at the exterior of the examination room normally, through the microphone 3 and the loudspeaker 4. While the switch 14 is in the ON state, the switch 13 for a sound transmission from the exterior of the examination room to the interior of the examination room remains in the OFF state. When the switch 13 is turned into the ON state as the communication from the exterior of the examination room to the interior of the examination room is required, the switch 14 is turned into the OFF state such that the sounds generated inside the examination room are inaudible at the exterior of the examination room while the speeches uttered outside of the examination room are transmitted to the interior of the examination room through the microphone 1 and the loudspeaker 2.

In addition, during the application of the reading gradient field pulses 10, the switch 14 is also turned into the OFF state according to the signal supplied from the sequence controller 15 to the intercom controller 16, along with the switch 13 which remains in the OFF state, as indicated in FIG. 2B, such that any sound generated inside the examination room, including the noise due to the vibration of the bobbin around which the gradient field coils are wound, becomes inaudible at the exterior of the examination room while the reading gradient field pulses are applied.

Thus, except for the periods at which the switch 13 is turned into the ON state and the periods at which the application of the reading gradient field pulses takes place, the switch 14 is in the ON state such that the speeches uttered by the patient inside the examination room is audible at the exterior of the examination room.

Here, the period for which each reading gradient field pulse is applied is approximately 60 msec, while the time interval between successive applications of the reading gradient field pulses is approximately 1 sec, so that the speech uttered by the patient inside the examination room during the repeated applications of the reading gradient field pulses is practically audible at the exterior of the examination room as a continuous speech, while the noise due to the application of the reading gradient field pulses is effectively removed from the sounds transmitted to the exterior of the examination room through the microphone 3 and the loudspeaker 4.

Consequently, according to this first embodiment, it becomes possible to provide an MRI system with the intercom facility in which the disturbing and potentially harmful large noise due to the application of the reading gradient field pulses can be reduced at the exterior of the examination room.

Figure 3:
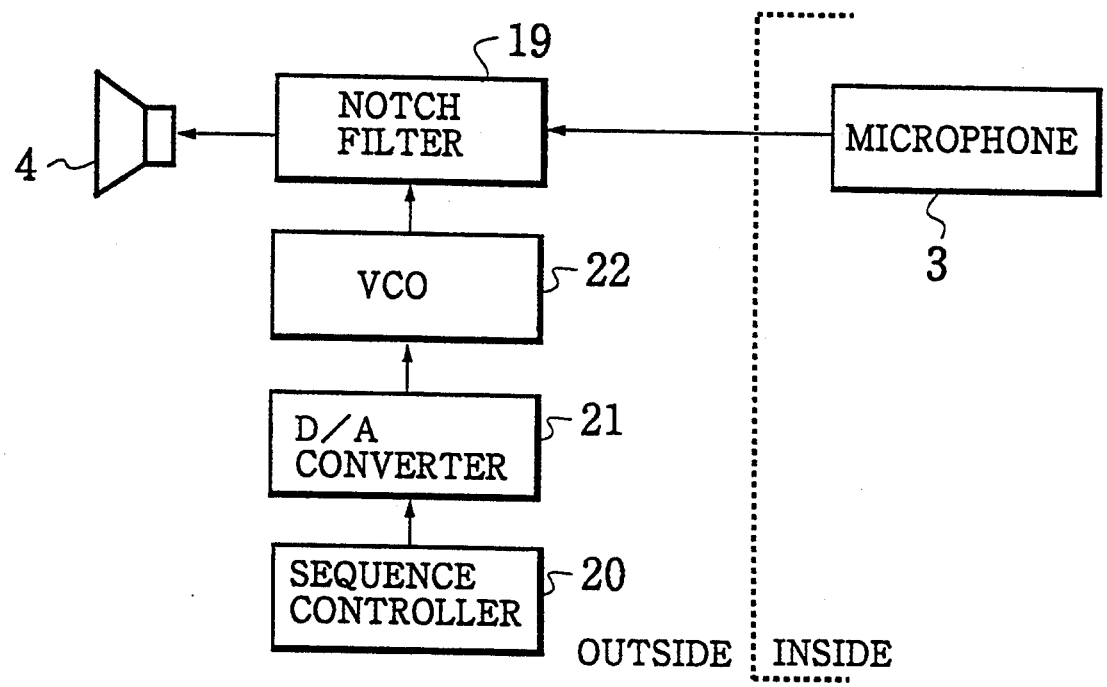
FIG. 3 is a schematic block diagram of a part of an intercom to be used in a second embodiment of an MRI system with intercom facility according to the present invention.

Referring now to FIG. 3, the second embodiment of an MRI system with intercom facility according to the present invention will be described in detail.

Figure 1A:
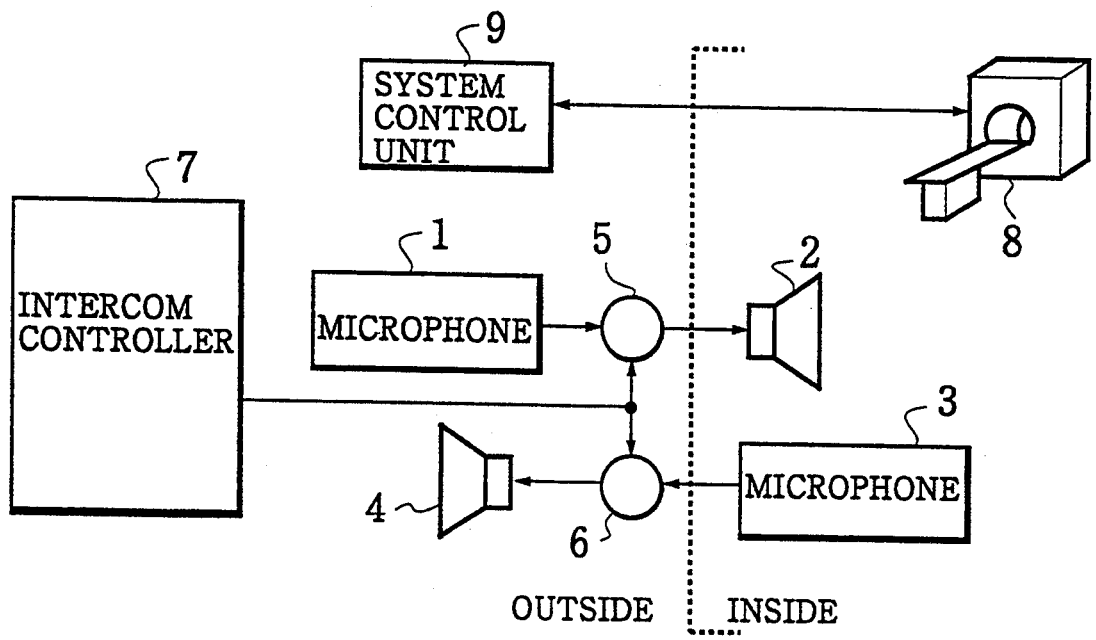
FIG. 1A is a schematic block diagram of a conventional MRI system with intercom facility.
Figure 1B:
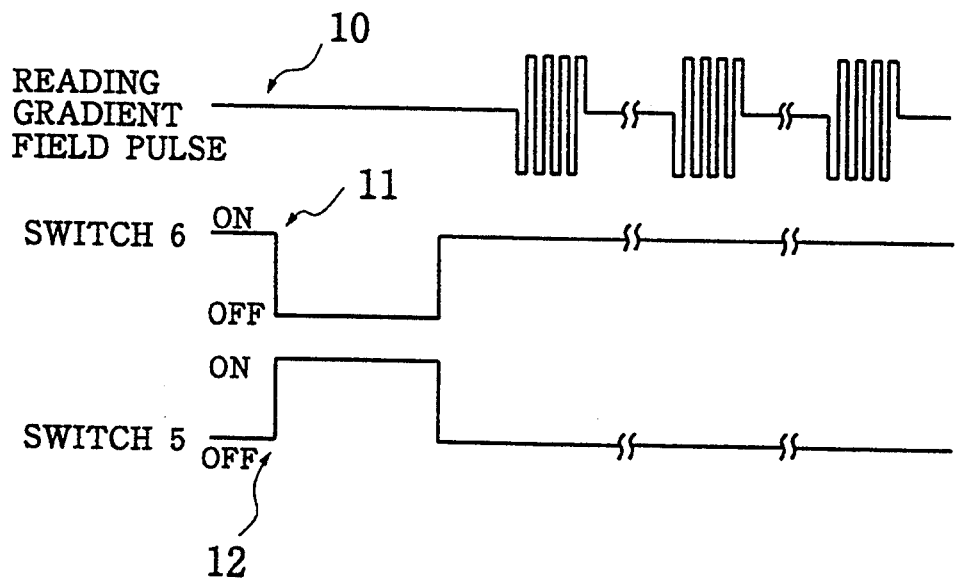
FIG. 1B is a timing chart for the controlling to be made by an intercom controller in the conventional MRI system of FIG. 1A.

FIG. 3 shows a configuration of a part for a sound transmission from the interior of the examination room to the exterior of the examination room in the intercom to be used in the MRI system, in which the the frame body of the MRI apparatus is located inside the examination room and the system control unit of the MRI apparatus is located outside the examination room, just as in cases shown in FIG. 1A and FIG. 2A described above.

Here, this part shown in FIG. 3 comprises: the microphone 3 and the loudspeaker 4 similar to those used in the first embodiment described above; a notch filter 19 connected between the microphone 3 and the loudspeaker 4; a VCO (Voltage Controlled Oscillator) 22 connected to the notch filter 19; a D/A converter connected to the VCO 22; and a sequence controller 20 connected to the D/A converter as well as to the frame body (not shown in FIG. 3).

The notch-filter 19 can be formed by using a switched capacitor filter whose cut-off frequency is determined by the frequency of the externally supplied clock signal, which will function as a central frequency in the notch filter 19. At this notch filter 19, the central frequency component of the sound signals transmitted from the microphone 3 is attenuated, and the obtained sound signals with the attenuated central frequency component are supplied to the loudspeaker 4.

The sequence controller 20 supplies the pulse sequence to be executed to the frame body, while also supplying the reading gradient field pulses to the D/A converter 21 at which the supplied reading gradient field pulses are converted into analog pulse signals. The analog pulse signals obtained by the D/A converter 21 are then supplied to the VCO 22, which generates a triangular wave having a frequency proportional to an amplitude of the supplied analog pulse signals which is equal to a repetition frequency of the reading gradient field pulses. The triangular wave generated by the VCO 22 is then supplied to the notch filter 19 as the externally supplied clock signal specifying the central frequency.

Here, the main frequency component of the noise due to the application of the reading gradient field pulses coincides with the repetition frequency of the repeated applications of the reading gradient field pulses, so that the central frequency to be attenuated at the notch filter 19 is set to be equal to this repetition frequency by the VCO 22.

Thus, in this second embodiment, the speech uttered by the patient inside the examination room during the repeated applications of the reading gradient field pulses is hardly affected by the notch filter 19 and remains practically audible at the exterior of the examination room through the microphone 3 and the loudspeaker 4, while the noise due to the application of the reading gradient field pulses is attenuated to the practically undisturbing level by the notch filter 19.

Consequently, according to this second embodiment, it also becomes possible to provide an MRI system with the intercom facility in which the disturbing and potentially harmful large noise due to the application of the reading gradient field pulses can be reduced at the exterior of the examination room.

Figure 4:
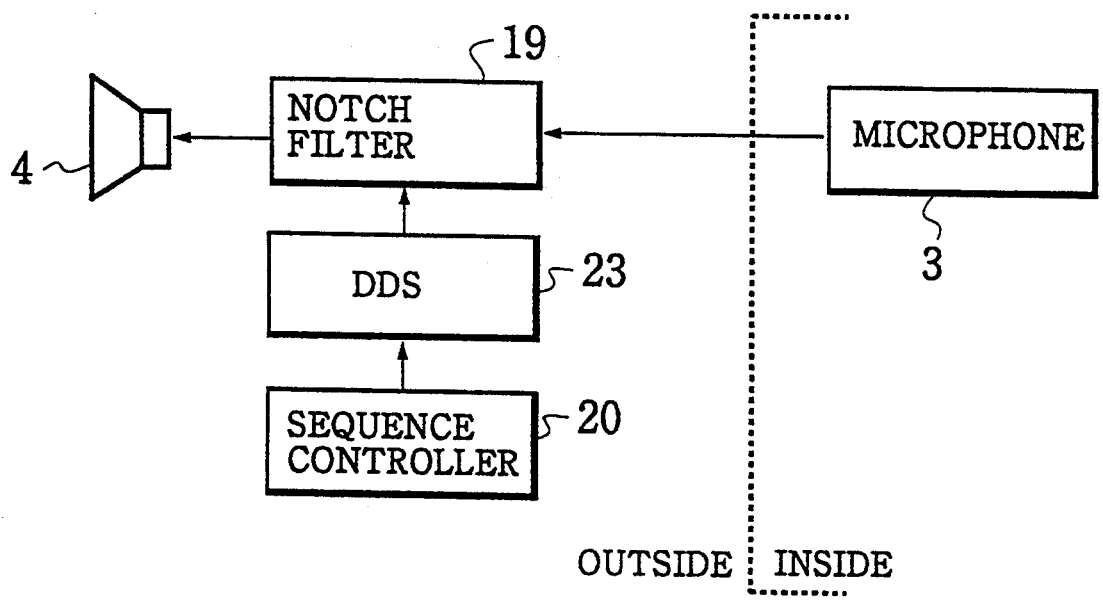
FIG. 4 is a schematic block diagram of a part of an intercom to be used in a third embodiment of an MRI system with intercom facility according to the present invention.

Referring now to FIG. 4, the third embodiment of an MRI system with intercom facility according to the present invention will be described in detail.

This third embodiment is a modification of the second embodiment described above, in which the D/A converter 21 and the VCO 22 used in the second embodiment of FIG. 3 are replaced by a DDS (Direct Digital Synthesizer) 23 to be connected between the notch filter 19 and the sequence controller 20, as shown in FIG. 3.

The sequence controller 20 supplies the reading gradient field pulses to the DDS 23 which generates pulse signals having a frequency equal to a repetition frequency of the supplied reading gradient field pulses, and supplies the generated pulse signals to the notch filter 19 as the externally supplied clock signal specifying the central frequency, such that the central frequency to be attenuated at the notch filter 19 is set by the DDS 23 to be equal to the repetition frequency of the repeated applications of the reading gradient field pulses in the pulse sequence.

Thus, in this third embodiment, the speech uttered by the patient inside the examination room during the repeated applications of the reading gradient field pulses is hardly affected by the notch filter 19 and remains practically audible at the exterior of the examination room through the microphone 3 and the loudspeaker 4, while the noise due to the application of the reading gradient field pulses is attenuated to the practically undisturbing level by the notch filter 19, just as in the second embodiment described above.

Consequently, according to this third embodiment, it also becomes possible to provide an MRI system with the intercom facility in which the disturbing and potentially harmful large noise due to the application of the reading gradient field pulses can be reduced at the exterior of the examination room.

It is to be noted here that many modifications and variations of the above embodiments may be made without departing from the novel and advantageous features of the present invention. Accordingly, all such modifications and variations are intended to be included within the scope of the appended claims.

What is claimed is:

1. A nuclear magnetic resonance imaging system, comprising:
   nuclear magnetic resonance imaging means for carrying out a nuclear magnetic resonance imaging, located inside an isolated examination room;
   sequence controller means for specifying a pulse sequence to be executed by the nuclear magnetic resonance imaging means; and
   intercom means including:
      microphone means, located inside the examination room, for picking up sounds generated inside the examination room;

loudspeaker means, located outside the examination room and adapted to be connected with the microphone means, for outputting the sounds picked up by the microphone means to the exterior of the examination room; and intercom controller means, connected with the sequence controller means, for disconnecting the microphone means and the loudspeaker means whenever an application of a reading gradient field pulse takes place in the pulse sequence specified by the sequence controller means.

2. The system of claim 1, wherein the sequence controller means supplies a signal indicative of a timing of each application of the reading gradient field pulse to the intercom controller means according to which the intercom controller means disconnects the microphone means and the loudspeaker means in the intercom means.

3. The system of claim 1, wherein the intercom means further includes:

additional microphone means, located outside the examination room, for picking up sounds generated outside the examination room;

additional loudspeaker means, located inside the examination room and adapted to be connected with the microphone means, for outputting the sounds picked up by the additional microphone means to the interior of the examination room.

4. The system of claim 3, wherein the intercom controller means disconnects the additional microphone means and the additional loudspeaker means whenever the microphone means and the loudspeaker means are connected.

5. The system of claim 3, wherein the intercom controller means disconnects the additional microphone means and the additional loudspeaker means whenever an application of a reading gradient field pulse takes place in the pulse sequence specified by the sequence controller means.

* * * * *